United States Patent
Bergmann et al.

(10) Patent No.: US 8,698,184 B2
(45) Date of Patent: Apr. 15, 2014

(54) LIGHT EMITTING DIODES WITH LOW JUNCTION TEMPERATURE AND SOLID STATE BACKLIGHT COMPONENTS INCLUDING LIGHT EMITTING DIODES WITH LOW JUNCTION TEMPERATURE

(75) Inventors: Michael John Bergmann, Chapel Hill, NC (US); Christopher D. Williams, Morrisville, NC (US); Kevin Shawne Schneider, Cary, NC (US); Kevin Haberern, Cary, NC (US); Matthew Donofrio, Raleigh, NC (US)

(73) Assignee: Cree, Inc., Durham, NC (US)

( * ) Notice: Subject to any disclaimer, the term of this patent is extended or adjusted under 35 U.S.C. 154(b) by 298 days.

(21) Appl. No.: 13/011,417

(22) Filed: Jan. 21, 2011

(65) Prior Publication Data

US 2012/0187431 A1 Jul. 26, 2012

(51) Int. Cl.
| H01L 33/00 | (2010.01) |
| H01L 23/48 | (2006.01) |
| H01L 23/52 | (2006.01) |
| H01L 29/40 | (2006.01) |
| C22C 5/02 | (2006.01) |
| C22C 13/00 | (2006.01) |
| C22C 30/04 | (2006.01) |

(52) U.S. Cl.
USPC ............... 257/99; 257/93; 257/783; 257/779; 257/E33.057; 420/507; 420/557; 420/589

(58) Field of Classification Search
None
See application file for complete search history.

(56) References Cited

U.S. PATENT DOCUMENTS

| D264,792 S | 6/1982 | Conti |
| D283,399 S | 4/1986 | Forbes, Jr. |
| 4,866,055 A | 9/1989 | Kato et al. |
| D305,410 S | 1/1990 | Tyler |
| 4,918,497 A | 4/1990 | Edmond |
| 4,966,862 A | 10/1990 | Edmond |
| 5,027,168 A | 6/1991 | Edmond |
| D327,234 S | 6/1992 | Vaughn |
| 5,210,051 A | 5/1993 | Carter, Jr. |
| 5,309,001 A | 5/1994 | Watanabe et al. |
| 5,338,944 A | 8/1994 | Edmond et al. |
| RE34,861 E | 2/1995 | Davis et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |

(Continued)

OTHER PUBLICATIONS

Chuang et al. A Fluxless Au-Sn Bonding Process of Tin-Rich Compositions Achieved in Ambient Air. 2002. IEEE. Electronic Components and Technology Conference. pp. 134-137.*

(Continued)

Primary Examiner — Hoang-Quan Ho
(74) Attorney, Agent, or Firm — Myers Bigel Sibley & Sajovec, P.A.

(57) ABSTRACT

A light emitting diode chip a support layer having a first face and a second face opposite the first face, a diode region on the first face of the support layer, and a bond pad on the second face of the support layer. The bond pad includes a gold-tin structure having a weight percentage of tin of 50% or more. The light emitting diode chip may include a plurality of active regions that are connected in electrical series on the light emitting diode chip.

41 Claims, 7 Drawing Sheets

(56) References Cited

U.S. PATENT DOCUMENTS

| | | | |
|---|---|---|---|
| 5,794,839 A | 8/1998 | Kimura et al. | |
| 5,856,231 A | 1/1999 | Niemann et al. | |
| 5,912,477 A | 6/1999 | Negley | |
| D421,046 S | 2/2000 | Popat | |
| 6,071,795 A | 6/2000 | Cheung et al. | |
| 6,120,600 A | 9/2000 | Edmond et al. | |
| 6,187,606 B1 | 2/2001 | Edmond et al. | |
| 6,201,262 B1 | 3/2001 | Edmond et al. | |
| 6,218,680 B1 | 4/2001 | Carter, Jr. et al. | |
| D448,404 S | 9/2001 | Hamilton et al. | |
| 6,396,080 B2 | 5/2002 | Carter, Jr. et al. | |
| 6,403,982 B2 | 6/2002 | Carter, Jr. et al. | |
| 6,420,199 B1 | 7/2002 | Coman et al. | |
| 6,518,598 B1 | 2/2003 | Chen | |
| 6,518,601 B2 | 2/2003 | Wirth | |
| 6,547,249 B2 * | 4/2003 | Collins et al. | 257/88 |
| 6,559,075 B1 | 5/2003 | Kelly et al. | |
| D476,680 S | 7/2003 | Haas | |
| 6,656,422 B2 * | 12/2003 | Masuda | 420/557 |
| 6,767,411 B2 * | 7/2004 | Yeh et al. | 148/24 |
| D495,116 S | 8/2004 | Trocme | |
| 6,800,500 B2 | 10/2004 | Coman et al. | |
| 6,814,459 B2 | 11/2004 | Pederson | |
| 6,847,052 B2 | 1/2005 | Fan et al. | |
| 6,853,010 B2 | 2/2005 | Slater, Jr. et al. | |
| 6,936,859 B1 * | 8/2005 | Uemura et al. | 257/99 |
| D521,565 S | 5/2006 | Stewart et al. | |
| 7,048,813 B2 * | 5/2006 | Miyazaki | 148/442 |
| 7,135,715 B2 | 11/2006 | Saxler | |
| 7,141,828 B2 | 11/2006 | Venugopalan | |
| 7,173,277 B2 * | 2/2007 | Tamura et al. | 257/59 |
| 7,247,514 B2 * | 7/2007 | Yamane et al. | 438/106 |
| 7,285,801 B2 * | 10/2007 | Eliashevich et al. | 257/96 |
| 7,319,044 B2 | 1/2008 | Han et al. | |
| 7,329,905 B2 | 2/2008 | Ibbetson et al. | |
| D566,057 S | 4/2008 | Edmond et al. | |
| 7,365,371 B2 | 4/2008 | Andrews | |
| D580,888 S | 11/2008 | Liu | |
| D582,865 S | 12/2008 | Edmond et al. | |
| 7,560,738 B2 * | 7/2009 | Liu | 257/88 |
| D599,748 S | 9/2009 | Liu | |
| D601,102 S | 9/2009 | Onikiri et al. | |
| D602,451 S | 10/2009 | Gielen | |
| 7,605,403 B2 | 10/2009 | Horio et al. | |
| D609,653 S | 2/2010 | Watanabe et al. | |
| D615,505 S | 5/2010 | Butterworth et al. | |
| 7,714,334 B2 | 5/2010 | Lin | |
| D620,897 S | 8/2010 | Shan et al. | |
| D621,801 S | 8/2010 | Hsieh | |
| D622,679 S | 8/2010 | Hsieh | |
| 7,781,323 B2 | 8/2010 | Shimokawa et al. | |
| D623,152 S | 9/2010 | Hwang et al. | |
| D624,510 S | 9/2010 | Liu et al. | |
| 7,795,623 B2 | 9/2010 | Emerson et al. | |
| 7,821,194 B2 | 10/2010 | Negley et al. | |
| D627,311 S | 11/2010 | Lai et al. | |
| D627,747 S | 11/2010 | Chu et al. | |
| 7,842,959 B2 * | 11/2010 | Lee et al. | 257/88 |
| D628,540 S | 12/2010 | Tsou | |
| 7,855,459 B2 | 12/2010 | Slater et al. | |
| D633,876 S | 3/2011 | Shan et al. | |
| 7,939,839 B2 * | 5/2011 | Hasnain | 257/93 |
| 7,947,993 B2 * | 5/2011 | Kim et al. | 257/93 |
| 7,982,409 B2 * | 7/2011 | Hasnain et al. | 315/294 |
| D645,008 S | 9/2011 | Shan et al. | |
| 8,017,963 B2 | 9/2011 | Donofrio et al. | |
| 8,049,242 B2 | 11/2011 | Lin et al. | |
| 8,084,775 B2 * | 12/2011 | Hasnain et al. | 257/93 |
| 8,178,893 B2 * | 5/2012 | Takashima et al. | 257/99 |
| 8,207,543 B2 * | 6/2012 | Hasnain | 257/93 |
| 8,395,166 B2 * | 3/2013 | Seo et al. | 257/91 |
| 2001/0017374 A1 | 8/2001 | Carter, Jr. et al. | |
| 2002/0068201 A1 | 6/2002 | Vaudo et al. | |
| 2003/0006418 A1 | 1/2003 | Emerson et al. | |
| 2003/0059972 A1 | 3/2003 | Ikeda et al. | |
| 2003/0123164 A1 | 7/2003 | Hsu et al. | |
| 2003/0143103 A1 * | 7/2003 | Masuda | 420/557 |
| 2003/0164214 A1 * | 9/2003 | Miyazaki | 148/678 |
| 2005/0151138 A1 | 7/2005 | Slater, Jr. et al. | |
| 2005/0215000 A1 | 9/2005 | Negley | |
| 2006/0214274 A1 | 9/2006 | Shimokawa et al. | |
| 2006/0284191 A1 | 12/2006 | Yang et al. | |
| 2007/0048885 A1 * | 3/2007 | Jeon | 438/22 |
| 2007/0102693 A1 * | 5/2007 | Nagai | 257/13 |
| 2007/0181900 A1 * | 8/2007 | Sato et al. | 257/99 |
| 2007/0253209 A1 * | 11/2007 | Loh et al. | 362/458 |
| 2007/0272940 A1 * | 11/2007 | Lee et al. | 257/99 |
| 2007/0286762 A1 * | 12/2007 | Oppermann | 420/507 |
| 2008/0003777 A1 | 1/2008 | Slater et al. | |
| 2008/0006837 A1 | 1/2008 | Park et al. | |
| 2008/0099772 A1 * | 5/2008 | Shuy et al. | 257/88 |
| 2008/0099777 A1 * | 5/2008 | Erchak et al. | 257/99 |
| 2008/0170396 A1 * | 7/2008 | Yuan et al. | 362/244 |
| 2008/0179602 A1 * | 7/2008 | Negley et al. | 257/88 |
| 2008/0210971 A1 | 9/2008 | Donofrio et al. | |
| 2008/0211416 A1 * | 9/2008 | Negley et al. | 315/193 |
| 2008/0217640 A1 * | 9/2008 | Suzuki et al. | 257/98 |
| 2008/0246051 A1 * | 10/2008 | Hosokawa et al. | 257/99 |
| 2009/0001402 A1 * | 1/2009 | Sakai | 257/99 |
| 2009/0085048 A1 * | 4/2009 | Lee et al. | 257/89 |
| 2009/0179207 A1 * | 7/2009 | Chitnis et al. | 257/88 |
| 2009/0224653 A1 | 9/2009 | Wang et al. | |
| 2009/0283787 A1 * | 11/2009 | Donofrio et al. | 257/98 |
| 2010/0038660 A1 * | 2/2010 | Shuja | 257/98 |
| 2010/0051977 A1 * | 3/2010 | Kim et al. | 257/93 |
| 2010/0059768 A1 * | 3/2010 | Hasnain | 257/93 |
| 2010/0109031 A1 * | 5/2010 | Lee et al. | 257/93 |
| 2010/0141175 A1 * | 6/2010 | Hasnain et al. | 315/294 |
| 2010/0155746 A1 | 6/2010 | Ibbetson et al. | |
| 2010/0163887 A1 * | 7/2010 | Kim et al. | 257/76 |
| 2010/0276706 A1 * | 11/2010 | Herrmann | 257/89 |
| 2011/0062465 A1 * | 3/2011 | Lee et al. | 257/93 |
| 2011/0098420 A1 | 4/2011 | Takizawa et al. | |
| 2011/0127563 A1 | 6/2011 | Lin et al. | |
| 2011/0147779 A1 * | 6/2011 | Kang et al. | 257/98 |
| 2011/0180839 A1 | 7/2011 | Donofrio et al. | |

OTHER PUBLICATIONS

Harris, J. et al., "Selecting Die Attach Technology for High-Power Applications", *Power Electronics Technology*, Nov. 1, 2009, 6 Pages, Retrieved from the internet http://www.ormetcircuits.com/d/bin-docs/Selecting_Die_Attach_Technology_for_High_Power_Applications.pdf.

International Search Report Corresponding to International Application No. PCT/US12/21253; Date of Mailing: Sep. 6, 2012; 25 Pages.

International Search Report Corresponding to International Application No. PCT/US2013/023041; Date of Mailing: Mar. 26, 2013; 13 Pages.

Notification Concerning Transmittal of International Preliminary Report on Patentability in corresponding PCT Application No. PCT/US2012/021253 mailed Aug. 1, 2013 (9 pages).

Minor et al., "Growth of a Au—Ni—Sn Intermetallic Compound on the Solder-Substrate Interface after Aging." Mar. 2000. Metallurgical and Materials Transactions A. vol. 31A. pp. 798-800.

Yoon et al. "Microstructural evolution of Sn-rich Au—Sn/Ni flip-chip solder joints under high temperature storage testing conditions." 2007. Scripta Materialia. vol. 56. pp. 661-664.

Mita et al. "Effect of Ni on reactive diffusion between Au and Sn at solid-state temperatures." 2006. Materials Science and Engineering B. vol. 126. pp. 37-43.

Anhock et al. "Investigations of Au/Sn alloys on different end-metallizations for high temperature applications." 1998. IEEE/CPMT Berlin Int'l Electronics Manufacturing Technology Symposium. pp. 156-165.

* cited by examiner

LIGHT EMITTING DIODES WITH LOW JUNCTION TEMPERATURE AND SOLID STATE BACKLIGHT COMPONENTS INCLUDING LIGHT EMITTING DIODES WITH LOW JUNCTION TEMPERATURE

BACKGROUND

Solid state lighting systems including one- or two-dimensional arrays of solid state lighting devices are used for a number of lighting applications. For example, solid state lighting panels including arrays of solid state light emitting devices have been used as direct illumination sources, for example, in architectural and/or accent lighting. Solid state lighting arrays are also commonly used as backlights for small liquid crystal display (LCD) screens, such as LCD display screens used in portable electronic devices. In addition, there has been increased interest in the use of solid state lighting arrays as backlights for larger displays, such as LCD television displays.

A solid state light emitting device may include, for example, a packaged light emitting device including one or more light emitting diodes (LEDs). Inorganic LEDs typically include semiconductor layers forming p-n junctions. Organic LEDs (OLEDs), which include organic light emission layers, are another type of solid state light emitting device. Typically, a solid state light emitting device generates light through the recombination of electronic carriers, i.e. electrons and holes, in a light emitting layer or region.

In an LCD backlight, it is common to arrange LED devices in a linear array on a metal bar, called a "light bar", which is arranged within an LCD backlight unit to emit light parallel to the LCD screen. The light is directed toward the LCD screen by a light guide in the LCD backlight unit.

As LED applications, such a backlighting applications, transition to the use of fewer light sources, the individual light emitting device packages are required to emit more light per package. Accordingly, the present trend is toward using larger and larger size die to accommodate higher light output requirements. Larger LED dice are generally driven at higher forward currents to obtain the desired light output.

Present technology uses LED devices that are attached to packages, heatsinks and/or submounts with silicone die attach. As a die attach material, silicone is not ideal. It is a poor thermal conductor, which may limit the reliability and/or performance of LED die and packages at the higher drive currents needed for higher light output.

Die attach metals may have better thermal conductivity than silicone. However, conventional die attach metals may be unsuited for attachment to plastic packages, such as those used in backlighting applications.

A typical die attach metal is a eutectic Au/Sn alloy, with 80% Au and 20% Sn (by weight). The Au/Sn 80/20 alloy has good mechanical strength, reliability, and thermal conductivity, and is recognized as a standard die attach alloy.

A challenge with the AuSn 80/20 alloy die attach is the requirement of a hot reflow to form the bond, typically in the range of about 305° C. Many plastic packages or chip-on-board packages are adversely affected by exposure to elevated temperatures. The packages may fail catastrophically at temperatures in excess of 300° C. o may suffer material degradation, for example, browning and/or yellowing of the package, which reduces the reflectivity and hence the brightness of the package.

Furthermore, as the number of devices in a lighting unit, such as a light bar, decreases, the overall voltage across the bar may also decrease, resulting in a need to drop the line (supply) voltage further to the operating voltage of the low-voltage bar that includes fewer, larger LED dice. This may require a more complicated power supply that has more dissipation loss, resulting in lower overall system efficiency.

SUMMARY

A light emitting diode chip according to some embodiments includes a support layer having a first face and a second face opposite the first face, a diode region on the first face of the support layer, and a die attach pad on the second face of the support layer. The die attach pad includes a gold-tin structure having a weight percentage of tin of 40% or more.

The support layer may be insulating or semi-insulating, and in some embodiments, the support layer may include semi-insulating silicon carbide.

The diode region may include a plurality of isolated active regions on the first face of the support layer, each of the isolated active regions including an anode contact and a cathode contact.

The light emitting diode may further include a first bond pad on an anode contact of a first one of the isolated active regions and a second bond pad on a cathode contact of a second one of the isolated active regions.

The isolated active regions are arranged in a row extending from a first end of the support layer to a second end of the support layer opposite the first end, and the cathode contact of each of the isolated active regions may be provided on a side of the isolated active region nearest the second end of the support layer.

The isolated active regions include a first active region and a second active region adjacent the first active region, the light emitting diode chip may further include an insulating layer between the first active region and the second active region, and an electrical interconnect on the insulating layer and conductively connecting the cathode contact of the first active region to the anode contact of the second active region.

The isolated active regions may be connected in electrical series.

The light emitting diode chip may further include a first bond pad on an anode contact of a first one of the isolated active regions and a second bond pad on a cathode contact of a second one of the isolated active regions.

The die attach pad may include a layer of gold and a layer of tin on the layer of gold. The layer of gold may include a first layer of gold, and the die attach pad may further include a second layer of gold. The layer of tin may be between the first layer of gold and the second layer of gold. The bondpad may include a layer of nickel between the layer of tin and the second layer of gold. A thickness of the layer of tin may be about three times a combined thickness of the first layer of gold and the second layer of gold.

The weight percentage of tin in the die attach pad may be at least about 50%. In some embodiments, the weight percentage of tin in the die attach pad may be at least about 60%, and in still further embodiments, the weight percentage of tin in the die attach pad may be at least about 70%, and in yet further embodiments, the weight percentage of tin in the die attach pad may be at least about 90%.

The light emitting diode chip may further include a layer of titanium between the die attach pad and the support layer. In some embodiments, the light emitting diode chip may further include a layer of platinum between the die attach pad and the layer of titanium. In still further embodiments, the light emitting diode chip may further include a layer of nickel between the die attach pad and the layer of platinum.

A light bar according to some embodiments includes an elongated support member, and a plurality of light emitting diode chips mounted on the elongated support member. Each of the light emitting diode chips includes a support layer having a first face and a second face opposite the first face, a diode region on the first face of the support layer, and a die attach pad on the second face of the support layer. Each of the die attach pads includes a gold-tin structure having a weight percentage of tin of 40% or more. The light emitting diode chips are mounted to the elongated support member by their respective die attach pads.

A light bar for backlighting a liquid crystal diode display according to some embodiments may include an elongated support member, and a plurality of light emitting diode devices mounted on the elongated support member. Each light emitting diode device may include at least three isolated active regions connected in electrical series.

Each of the light emitting diode devices may include a support layer having a first face and a second face opposite the first face, and a diode region on the first face of the support layer. The diode region may include a plurality of isolated active regions connected in electrical series.

Each of the light emitting diode devices may include a light emitting diode package including a submount and at least three singulated light emitting diodes on submount, an anode contact and a cathode contact. The at least three singulated light emitting diodes are connected in electrical series between the anode contact and the cathode contact.

Each of the light emitting diode devices may include a light emitting diode package including a submount and a singulated light emitting diode die on submount, an anode contact and a cathode contact. The singulated light emitting die may include a plurality of isolated active regions on a common substrate, which may be connected in electrical series between the anode contact and the cathode contact.

A liquid crystal diode display according to some embodiments may include a liquid crystal display panel, a diffuser sheet adjacent the liquid crystal display panel, and a light bar adjacent to the diffuser sheet including a linear array of light emitting diode devices configured to emit light when energized into an edge of the diffuser sheet. The light bar may include an elongated support member and a plurality of light emitting diode devices mounted on the elongated support member. Each light emitting diode device may include at least three isolated active regions connected in electrical series.

A light emitting diode chip according to further embodiments includes a diode region having a first face and a second face, and a die attach pad on the first face of the diode region. The die attach pad includes a gold-tin structure having a weight percentage of tin greater than 40%.

A light emitting diode chip according to further embodiments includes a diode region having a first face and a second face and a die attach pad on the first face of the diode region. The die attach pad includes at least one layer of gold and a layer of tin on the at least one layer of gold, and a weight percentage of tin in the die attach pad relative to a total weight of the layer of tin and the at least one layer of gold is greater than 20%.

The light emitting diode may further include an anode contact on the second face of the diode region, and the die attach pad may include a cathode contact.

The light emitting diode may further include a cathode contact on the second face of the diode region, and the die attach pad may include an anode contact.

In some embodiments, the light emitting diode may further include a substrate on the second face of the diode region and a cathode contact on the substrate, and the die attach pad may include an anode contact.

A light emitting diode chip according to some embodiments includes a support layer having a first face and a second face opposite the first face, and a diode region on the first face of the support layer. The diode region may include a plurality of isolated active regions on the first face of the support layer, each of the isolated active regions including an anode contact and a cathode contact. A metal die attach pad is on the second face of the support layer.

The light emitting diode chip may further include a first bond pad on an anode contact of a first one of the isolated active regions and a second bond pad on a cathode contact of a second one of the isolated active regions.

The isolated active regions may be connected in electrical series.

The light emitting diode chip may further include a first bond pad on an anode contact of a first one of the isolated active regions and a second bond pad on a cathode contact of a second one of the isolated active regions.

The isolated active regions may be arranged in a row extending from a first end of the support layer to a second end of the support layer opposite the first end, and the cathode contact of each of the isolated active regions may be provided on a side of the isolated active region nearest the second end of the support layer.

The isolated active regions include a first active region and a second active region adjacent the first active region. The light emitting diode chip may further include an insulating layer between the first active region and the second active region, and an electrical interconnect on the insulating layer and conductively connecting the cathode contact of the first active region to the anode contact of the second active region.

The die attach pad may include a layer of gold and a layer of tin on the layer of gold. The die attach pad may have a weight percentage of tin greater than 40%.

Some embodiments provide methods of attaching a light emitting diode die including a metal bonding pad to a submount including a die attach pad. The methods include bonding the metal bonding pad to the die attach pad at a temperature less than 250° C. to provide a metal bond having a reflow temperature greater than 260° C.

The metal bonding pad may include a layer of tin and at least one layer of gold. The method the die attach pad may include a gold-tin structure having a weight percentage of tin greater than 40%.

Other systems, methods, and/or computer program products according to embodiments of the invention will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
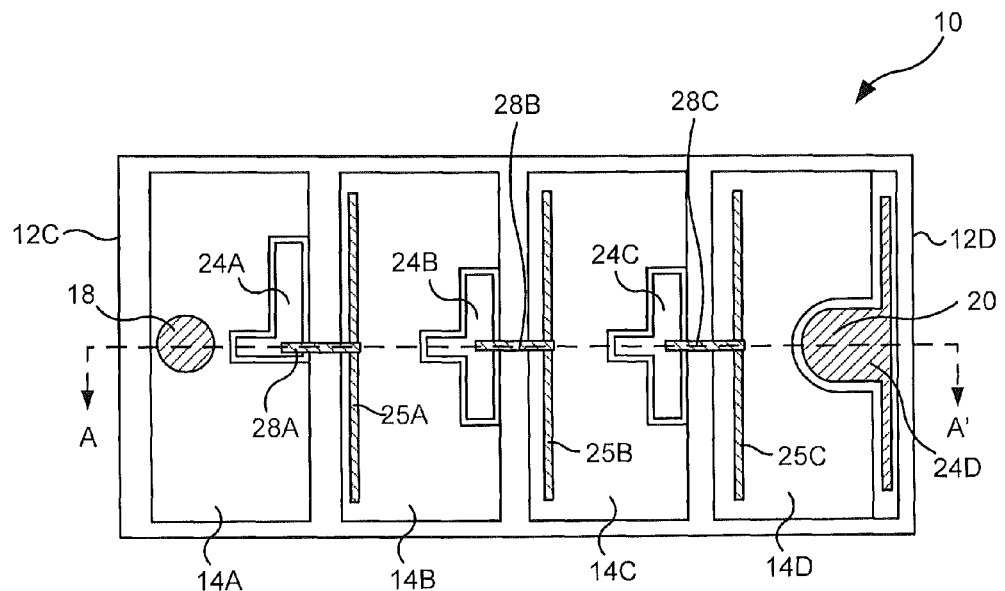
FIG. 1 is a plan view of a light emitting diode structure according to some embodiments.

Embodiments of the present invention are directed towards methods and devices that may improve the thermal characteristics of a solid state lighting apparatus, such as a light bar, and in some cases may reduce the operating temperature of a solid state lighting apparatus. Some embodiments provide a light emitting device die design including a plurality of isolated active junctions configured to be connected in series on the die. Providing a die with multiple junctions that are connected in series may allow the chip to produce a high light output while driving the chip at a relatively low current, thereby reducing the operating temperature of the device. Furthermore, some embodiments provide a metal die attach for a light emitting device die that decreases the thermal resistance of a package incorporating the die, thereby potentially reducing the operating temperature of the device, while permitting the device to be manufactured using a lower temperature reflow that may not adversely affect plastic material in the device package.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "between", "below," "above," "upper," "lower," "horizontal," "lateral," "vertical," "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

As noted above, a typical die attach metal is a eutectic Au/Sn alloy, with 80% Au and 20% Sn (by weight). The Au/Sn 80/20 alloy has good mechanical strength, reliability, and thermal conductivity, and is recognized as a standard die attach alloy. However, an AuSn 80/20 alloy die attach may require a reflow in the range of about 305° C., which can adversely affect plastic packages or chip-on-board packages.

Some embodiments provide a metal die attach including an Sn rich structure that reflows at temperatures less than 250° C. In particular, some embodiments provide an AuSn metal die attach that includes about 40% or more (by weight) of Sn. In some embodiments, the weight percent of Sn in the die attach structure may be greater than 60%, and in some embodiments the weight percent of Sn in the die attach structure may be greater than 70%. In some further embodiments, the weight percent of Sn in the die attach structure may be greater than 75%, and in still further embodiments the weight percent of Sn in the die attach structure may be greater than 90%.

In still further embodiments, because gold and tin are layered in the die attach stack, the tin may melt at a lower temperature than an AuSn alloy having a comparable weight percentage of tin. Thus, in some embodiments, the weight percent of tin in the die attach structure may be greater than 20%.

A die attach structure according to some embodiments may reflow and bond at temperatures less than 250° C. The lower reflow temperature of a metal die attach structure as described herein may allow the use of lower reflow temperatures, which may mitigate or reduce the negative effect of high temperature solder reflow on a plastic package body, while providing a metallic submount bond that has enhanced thermal properties, such as reduced thermal resistance, relative to a conventional die attach material, such as silicone.

Moreover, a metal die attach structure as disclosed herein can remain stable during a RoHS (Restriction of Harmful Substances)—compliant package reflow, which allows temperatures up to 260° C. That is, a metal stack according to some embodiments may have a reflow temperature less than about 250° C., but once bonded may remain stable at temperatures above 260° C.

Figure 2:
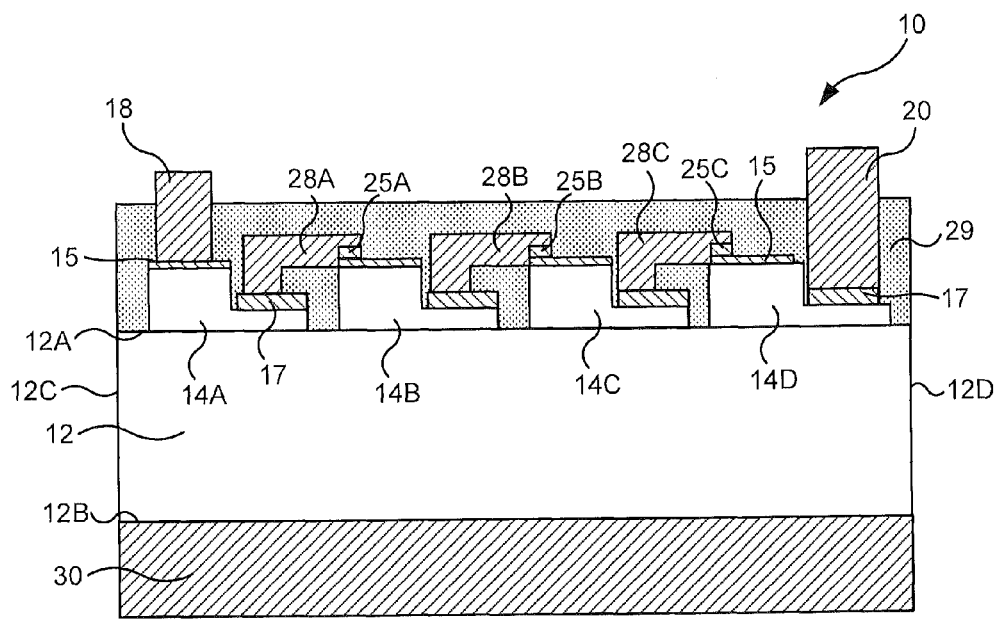
FIG. 2 is a cross-sectional view of a light emitting diode structure according to some embodiments taken along line A-A' of FIG. 1.

FIG. 1 is a plan view of a light emitting diode die (or chip) 10 according to some embodiments, while FIG. 2 is a cross sectional view of a light emitting diode structure according to some embodiments taken along line A-A' of FIG. 1.

Referring to FIGS. 1 and 2, a light emitting diode die 10 according to some embodiments is a unitary semiconductor device that includes a support layer 12 having a first face 12A and a second face 12B opposite the first face 12A. A diode region including a plurality of isolated active regions 14A-14D is on the first face 12A of the support layer 12. The active regions 14A-14D may be isolated from one another by means of mesa isolation (as illustrated in FIGS. 1-2) or other techniques, such as implant isolation, trench isolation, etc.

Each of the active regions 14A-14D may include a single p-n junction. Thus, the light emitting diode die 10 may be referred to as a multi-junction die. This structure is not to be confused with a multiple quantum well diode structure, which is well known in the art. A multiple quantum well structure has an active region that may include multiple stacked quantum wells in which recombination occurs to generate light. However, a conventional multiple quantum well structure may still have only a single p-n junction. In contrast, a light emitting diode die 10 according to some embodiments may have multiple isolated active regions, and hence may have multiple isolated p-n junctions.

Each of the isolated active regions includes an anode contact 15 and a cathode contact 17.

A die attach pad 30 is on the second face of the support layer. The bond pad includes a gold-tin structure having a weight percentage of tin of 50% or more.

The light emitting diode die 10 may further include a first wirebond pad 18 on an anode contact 15 of a first one 14A of the isolated active regions and a second wirebond pad 20 on a cathode contact 17 of a second one 14D of the isolated active regions. Moreover, the isolated active regions 14A-14D may be connected in series by means of metal interconnects 28A, 28B and 28C which contact respective current spreading fingers 25A, 25B, 25C on the anode contacts 15. As illustrated in FIG. 2, metal interconnect 28A may electrically connect the cathode contact 17 of the first one 14A of the isolated active regions and the anode contact 15 of the second one 14B of the isolated active regions. Metal interconnect 28B may electrically connect the cathode contact 17 of the second one 14B of the isolated active regions and the anode contact 15 of the third one 14C of the isolated active regions. Similarly, metal interconnect 28C may electrically connect the cathode contact 17 of the third one 14C of the isolated active regions and the anode contact 15 of the fourth one 14D of the isolated active regions. The isolated active regions 14A-14D may thereby be connected in electrical series by the electrical interconnects 28A-28C.

Accordingly, the isolated active regions 14A-14D may be connected in series to form an electronic device having a single anode contact (wire bond pad 18) and a single cathode contact (wire bond pad 20).

The support layer 12 may be insulating or semi-insulating, and in some embodiments, the support layer may include semi-insulating silicon carbide, which is available from the assignee Cree, Inc. In some embodiments, the support layer 12 may be a growth substrate on which the epitaxial semiconductor layers that form the isolated active regions 14A-14D are grown. In other embodiments, the support layer may include a carrier layer on which the isolated active regions 14A-14D are supported. In still further embodiments, the support layer may include a layer of a semi-insulating gallium nitride based semiconductor material on which the epitaxial semiconductor layers that form the isolated active regions 14A-14D are grown.

The formation of semi-insulating gallium nitride is well known in the art, and is described, for example in U.S. Pat. No. 7,135,715, the disclosure of which is incorporated herein by reference as if set forth herein.

Semi-insulating SiC may include silicon carbide doped with deep level transition elements, such as vanadium, as described in U.S. Pat. No. 5,856,231, the disclosure of which is incorporated herein by reference as if set forth herein, and/or may include high purity semi-insulating silicon carbide. A high-purity semi-insulating (HPSI) silicon carbide boule may be formed using a seeded sublimation growth technique. Exemplary sublimation growth techniques are more fully described in U.S. Patent Publication No. 2001/0017374 and in U.S. Pat. Nos. 6,403,982, 6,218,680, 6,396,080, 4,866,005 and Re. 34,861, the disclosures of which are hereby incorporated herein by reference. Sublimation techniques may also include gas fed sublimation, continuous growth and high-temperature CVD.

The isolated active layers may be formed using gallium nitride based materials. For example, the semiconductor light emitting device may be gallium nitride-based LEDs such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

The light emitting devices may include a substrate that has been thinned, for example, by etching, mechanical lapping or grinding and polishing, to reduce the overall thickness of the structure. Techniques for thinning a substrate are described in U.S. Patent Publication No. 2005/0151138 entitled "Methods Of Processing Semiconductor Wafer Backsides Having Light Emitting Devices (LEDS) Thereon And LEDs So Formed," the disclosure of which is hereby incorporated by reference as if set forth fully herein. Furthermore, a substrate may be shaped or roughened using sawing, laser scribing or other techniques to introduce geometrical features such as angled sidewalls which may increase light extraction. The substrate may be further etched to improve light extraction using for example the etch process described in US,. Patent Publication No. 2005/0215000 entitled "Etching Of Substrates Of Light Emitting Diodes," the disclosure of which is hereby incorporated by reference as if set forth fully herein.

Alternatively, the substrate may be remove entirely by substrate removal techniques such as the techniques taught in U.S. Pat. Nos. 6,559,075, 6,071,795, 6,800,500 and/or 6,420,199 and/or U.S. Patent Publication No. 2002/0068201, the disclosures of which are hereby incorporated by reference as if set forth fully herein.

Referring still to FIGS. 1 and 2, in some embodiments, the isolated active regions 14A-14D are arranged in a row extending from a first end 12C of the support layer 12 to a second end 12D of the support layer 12 opposite the first end 12C. In some embodiments, the anode contact 15 of each of the isolated active regions 14A-14D may be provided on a side of the isolated active region nearest the first end 12C of the support layer 12, while the cathode contact 17 of each of the isolated active regions 14A-14D may be provided on a side of the isolated active region nearest the second end 12D of the support layer 12.

The light emitting diode die 10 may further include an insulating layer 29 on the support layer 12 and between respective ones of the active regions 14A-14D. The electrical interconnects 28A-28C may be at least partially provided on portions of the insulating layer 29. Moreover, other portions of the insulating layer 29 may be provided on the active regions 14A-14D and on the interconnects 28A-28C.

The insulating layer 29 may include, for example, an insulating material, such as silicon oxide, silicon nitride, polyimide, or any other suitable insulator. The insulating layer 29 may include a single layer of insulating material and/or may be formed in multiple layers of the same or different material.

In some embodiments, the insulating layer 29 may include an encapsulant material, such as silicone, epoxy resin, or the like. Furthermore, the insulating layer 29 may include phosphor materials, such as those described in U.S. Pat. No. 6,853,010, entitled Phosphor-Coated Light Emitting Diodes Including Tapered Sidewalls and Fabrication Methods Therefor, and/or U.S. Pat. No. 7,821,194, entitled "Solid State Lighting Devices Including Light Mixtures" the disclosures of which are incorporated by reference herein as if set forth fully.

The wirebond pads 18, 20 may extend outside the insulating layer 29 to facilitate electrical contact to the die 10.

Although illustrated in FIGS. 1 and 2 as having four separate isolated active regions, it will be appreciated that a different number of isolated active regions may be formed that is either less than or greater than four. Furthermore, in some embodiments, the light emitting device chip may include only one active region.

Figure 3:
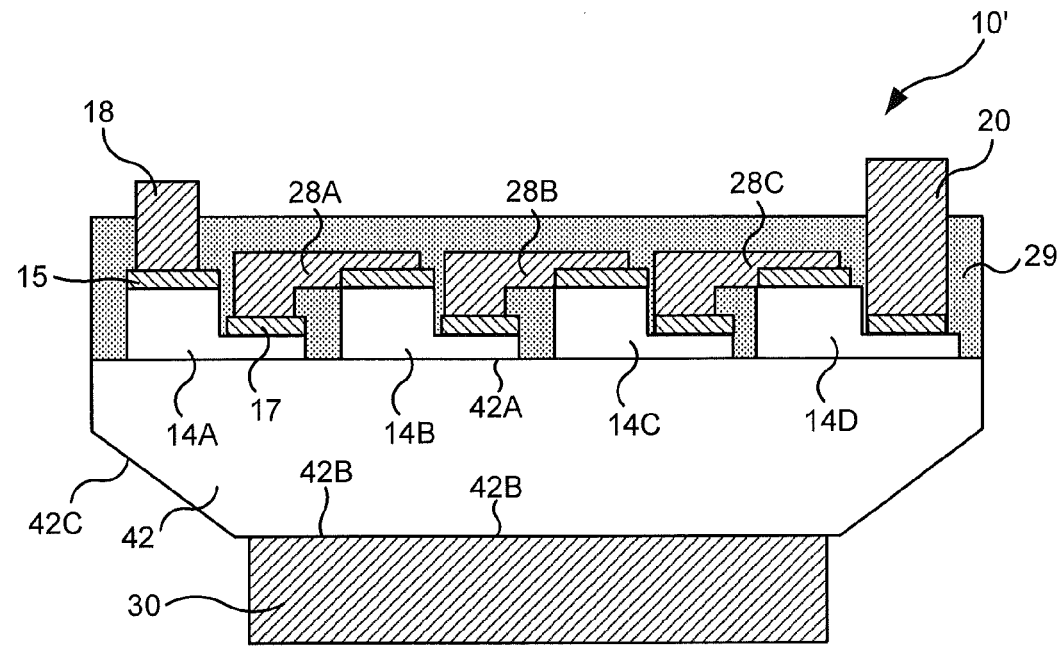
FIG. 3 is a cross-sectional view of a light emitting diode structure according to further embodiments.
Figure 4:
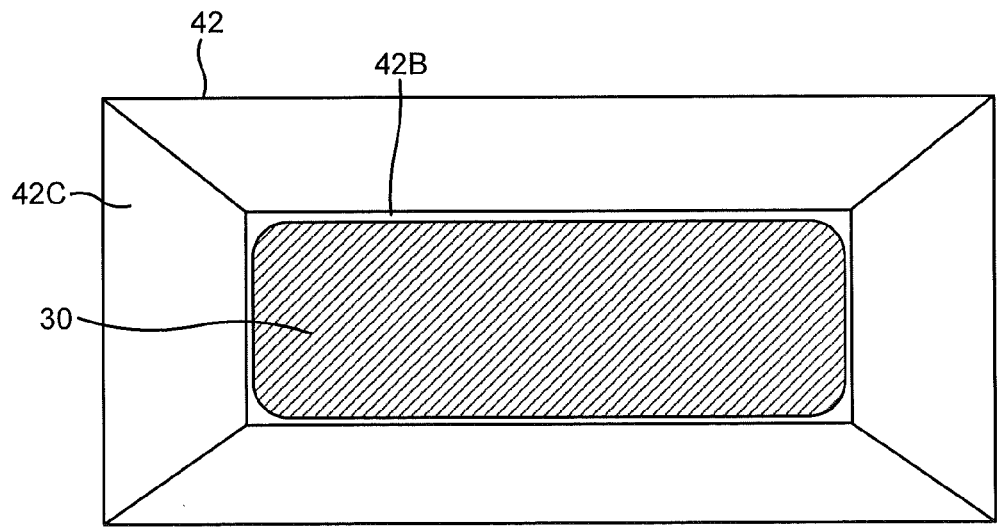
FIG. 4 is a bottom plan view of a light emitting diode structure according to further embodiments.

FIG. 3 is a cross view of a light emitting device die 10' according to further embodiments, and FIG. 4 is a bottom plan view of the light emitting device die 10'.

In the embodiments illustrated in FIGS. 3-4, the isolated active regions 14A-14C, the wirebond pads 18, 20, the metal interconnects 28A-28C, the anodes 15, the cathodes 17 and the insulating layer 29 may all be similar to those described above with respect to FIGS. 1-2.

In the embodiments of FIGS. 3-4, the die 10' includes a support layer 42 that has sidewalls 42C that are angled at an oblique angle to the upper and lower surfaces 42A, 42B of the support layer. In particular, the sidewalls 42C may be angled inwardly from the upper surface 42A on which the isolated active regions are provided to the lower surface 42B of the support layer 42.

The metal die attach pad 30 may be formed on the lower surface 42B and not on the angled sidewalls 42C of the support layer 42 to enhance light extraction when the chip 10' is mounted, for example, to a submount.

Figure 5:
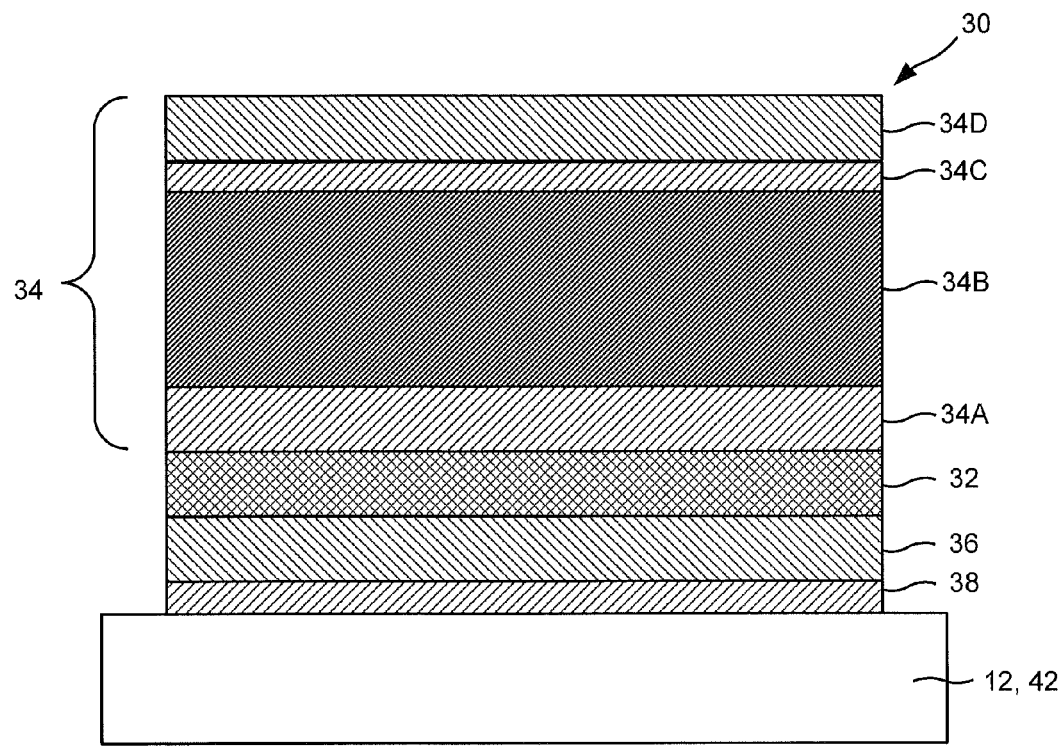
FIG. 5 is a cross-sectional view of a metal bond pad stack according to some embodiments.

FIG. 5 is a cross sectional view of a metal die attach pad 30 according to some embodiments. The die attach pad 30 may include a metal stack including a layer of titanium 38 in direct contact with the support layer 12, 42, a layer of platinum 36 on the titanium layer 38, and a layer of nickel 32 on the platinum layer 36.

The titanium layer 38 may have a thickness of about 5 angstroms to about 250 angstroms, and in particular may have a thickness of about 100 angstroms. The purpose of the titanium layer 38 is to promote adhesion.

The platinum layer 36 may have a thickness of about 1000 angstroms to about 5000 angstroms, and in particular may have a thickness of about 2500 angstroms. The purpose of the platinum layer 36 is to reduce tin migration to the titanium layer 38 during the bonding process, and to form a platinum-tin phase with excess molten tin to enhance stability under operation and thermal exposure.

The nickel layer 32 may have a thickness of about 1000 angstroms to about 5000 angstroms, and in particular may have a thickness of about 2000 angstroms. The purpose of the nickel layer 32 is to form a nickel-tin phase with excess molten tin during the bonding process, and to enhance stability under operation and thermal exposure.

The die attach pad 30 further includes a die attach (bonding) layer 34 that includes a first layer of gold 34A, a layer of tin 34B and a second layer of gold 34D. The die attach pad 30 may also include a layer of nickel 34C between the layer of tin 34B and the second layer of gold 34D. The purpose of the nickel layer 34C is to reduce diffusion of gold from the second gold layer 34D into the tin layer 34C during the deposition process. The nickel layer 34C may have a thickness between about 500 angstroms and about 2000 angstroms, and in particular may have a thickness of about 2000 angstroms.

A thickness of the layer of tin 34B may be about three times a combined thickness of the first layer of gold 34A and the second layer of gold 34D.

The weight percentage of tin in the die attach layer 34 and/or in the die attach pad 30, may be about 40% or more. In some embodiments, the weight percentage of tin in the bond pad may be at least about 50%, and in still further embodiments, the weight percentage of tin in the bond pad may be at least about 60%. In further embodiments, the weight percentage of tin in the bond pad may be at least about 70%, in still further embodiments, the weight percentage of tin in the bond pad may be at least about 75%, and in yet further embodiments, the weight percentage of tin in the bond pad may be at least about 90%.

Other metal layers, including for example one or more reflective layers of silver and/or aluminum, may be provided in the metal stack between the die attach layer 34 and the support layer 12, 42.

Figure 6:
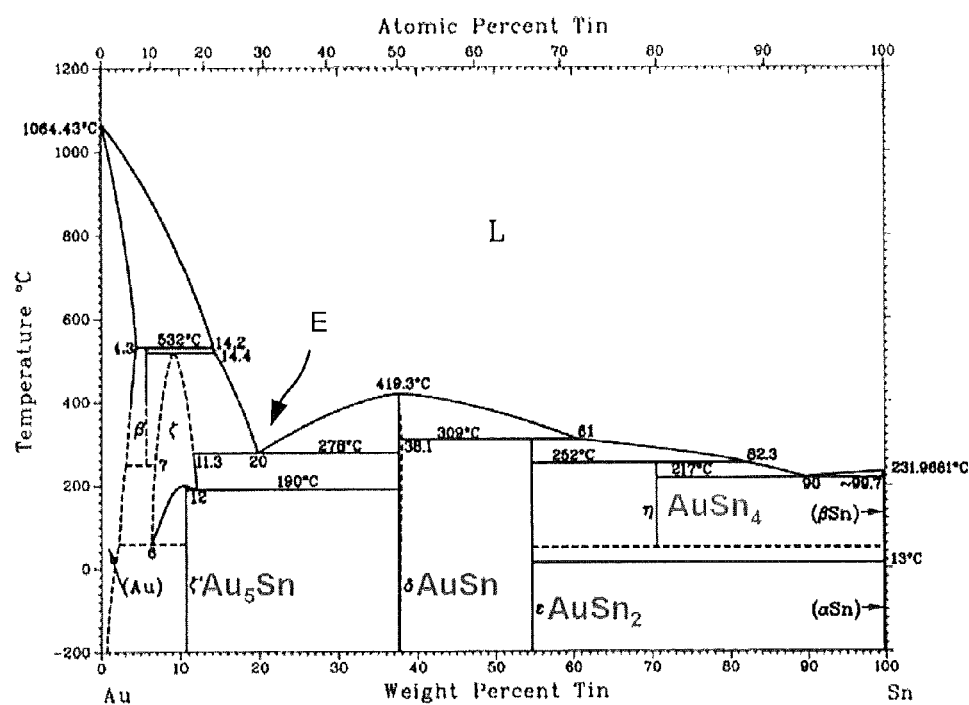
FIG. 6 is a graph of a phase diagram for the Au-Sn material system.

FIG. 6 is a graph of a phase diagram for the Au-Sn material system. In the graph of FIG. 6, temperature is shown on the ordinate (y-axis) while weight percent of tin is shown on the abscissa (x-axis). While not wishing to be bound by a particular theory, it is presently believed that, unlike a conventional 80/20 AuSn alloy, an alloy created during the melting and solidifying of the Au and Sn in the metal die attach pad 30 will not pass through the eutectic point E that exists in the AuSn system at about 20% Sn by weight (corresponding to about 29% tin by atomic percentage), as illustrated in FIG. 6.

Rather, because the slope of the liquidus curve of the AuSn alloy is negative for alloys with more than about 40% Sn by weight, the Au and Sn in the die attach pad 30 will melt at a relatively low temperature as the temperature of the die attach pad 30 is raised, and the high-Sn content melt will then solidify to an alloy that has a melting temperature that is greater than the melting temperature of the 80/20eutectic alloy, and in particular a melting temperature that is greater than 260° C. Rather, because the metal stack includes a layer of pure tin which has a melting point of about 230° C., a bonding process below 250° C. will be sufficient to melt the tin layer. The molten tin in contact with the gold, nickel, and platinum layers in the stack will solidify as various gold-tin and platinum-tin phases. These phases have higher melting points than pure tin according to their respective phase diagrams, and will therefore be thermally stable up to 260 C under operation and thermal exposure.

Figure 7:
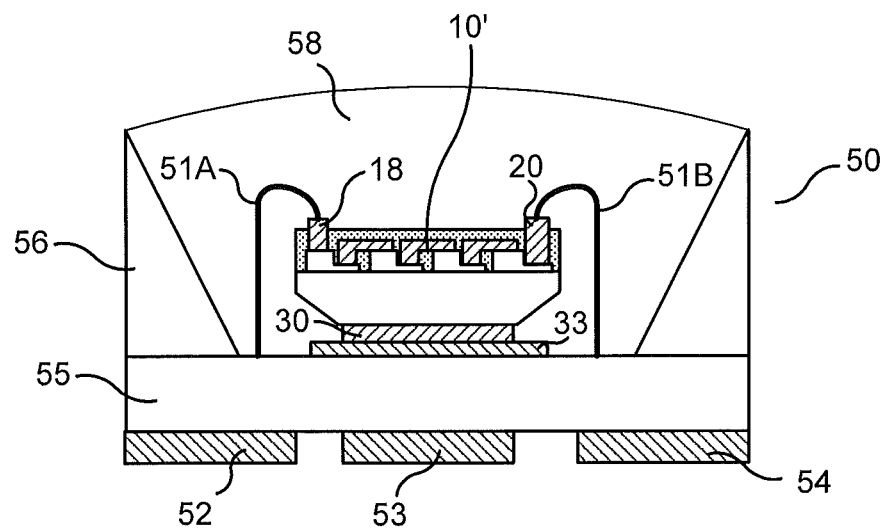
FIG. 7 is a cross-sectional view of a packaged device including a multiple active region light emitting diode according to some embodiments.

FIG. 7 is a cross sectional view of a package 50 including a multiple active region light emitting diode 10, 10' according to some embodiments. The package 50 includes a submount 55, which may include a thermally conductive material, such as aluminum nitride, copper, aluminum or the like. A reflector 56 is on the submount 55 and surrounds a die mounting region on an upper surface of the submount 55. The reflector 55 may be formed of a material that has specular reflective properties, such as aluminum, or it may be formed of a diffuse reflector, such as white plastic.

A multiple active region light emitting diode 10, 10' as described above is mounted on a bond pad or metal bonding region 33 in the die mounting region using the metal die attach pad 30 for die attach, and the device 10' is electrically connected to the package through wirebonds to the first and second bond pads 51A, 51B, which are electrically connected to anode and cathode pads 52, 54, respectively, of the package 50, for example, through conductive vias in the submount 55 (not shown).

A separate metal pad 53 may be provided to enhance thermal conduction from the package 50 to an external heat sink (not shown).

Accordingly, a package 50 includes a unitary light emitting diode chip that includes a plurality (e.g. four) separate active regions on a common substrate. The plurality of active regions are connected in series, so that the package 50 may have a single anode contact 52 and a single cathode contact 54.

A package 50 as illustrated in FIG. 7 may have particular advantages when used in a backlight for a liquid crystal display (LCD), because the package may emit an increased amount of light for a given level of current, and the package may have a higher forward voltage drop than a conventional package that includes only one LED chip or two LED chips connected in series.

That is, although it may be known to provide a package including two LED chips connected in series, that is typically only done to increase light output to compensate for low emission power. Such a package may have a forward voltage of about six volts. While a package including two LEDs may be used to increase light output, it is typically undesirable to increase the forward voltage of the package.

In contrast, a package 50 according to some embodiments may have a forward voltage that is greater than about 6 volts. In some embodiments, the package may have a forward voltage of about 9V or more, and in some embodiments the package may have a forward voltage of about 12 volts or more. Accordingly, a plurality of packages 50 may be provided in series in a structure, such as an LCD backlight unit. The packages 50 may each have a high level of light emission and also a high forward voltage, so that the overall forward voltage of the series may be better matched to the output voltage of a DC power supply that provides current to the LED structure.

Figure 8:
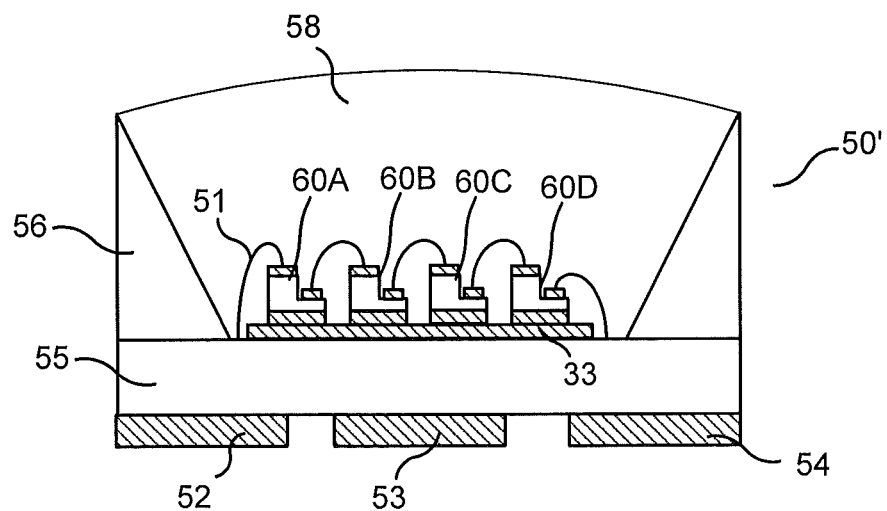
FIG. 8 is a cross-sectional view of a packaged device including multiple single active region light emitting diodes according to some embodiments.

FIG. 8 is a cross sectional view of a packaged device 50' including multiple single active region light emitting diodes according to further embodiments. The package 50' is similar to the package 50 illustrated in FIG. 7. However, instead of one multi junction LED chip, the package 50 includes a plurality of singulated single-junction LED chips 60A-60D connected in electrical series by wirebonds 51. A package 50' may have similar advantages for use in LCD backlighting, as the package may generate increased light output for a given level of current while having a higher forward voltage drop over a single packaged component.

Figure 9:
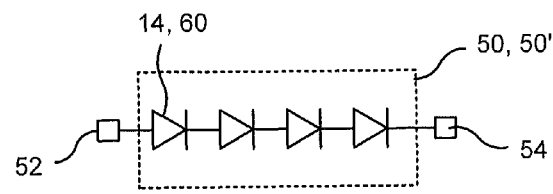
FIG. 9 is a schematic diagram of a packaged device according to some embodiments.

FIG. 9 is a schematic diagram of a packaged device 50, 50' according to some embodiments. As shown in FIG. 9, a packaged device 50, 50' may include a single package body having a single anode contact 52 and a single cathode contact 54 made to a group of light emitting diode junctions 14, 60 coupled in electrical series.

Figure 10:
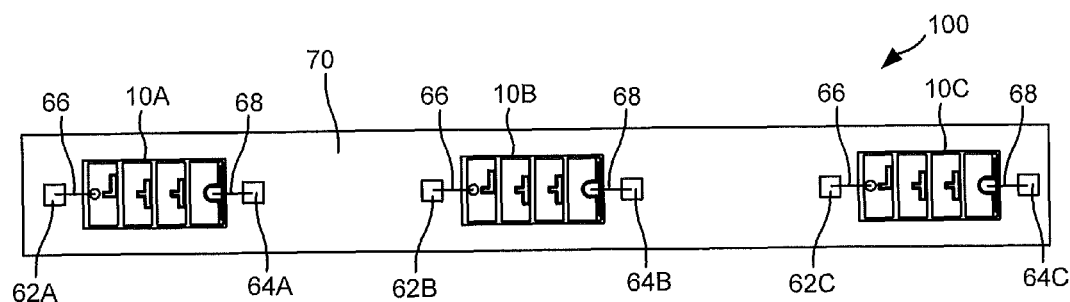
FIGS. 10 and 11 are plan views of a light bars including a plurality of light emitting diodes according to some embodiments.

FIG. 10 is a plan view of a light bar 100 including a plurality of light emitting devices 10 according to some embodiments.

A light bar 100 according to some embodiments includes an elongated support member 70, and a plurality of light emitting devices 10A-10C mounted on the elongated support member 70. Each of the light emitting diode chips 10A-10C may have a structure as illustrated in FIGS. 1-4. Thus, each of the light emitting diode chips 10A-10C may include a support layer 12, 42 having a first face and a second face opposite the first face, a diode region on the first face of the support layer 12, 42, and a die attach pad 30 on the second face of the support layer 12, 42. Each of the bond pads includes a gold-tin structure having a weight percentage of tin greater than 40%. The light emitting diode chips 10A-10C are mounted to the elongated support member by their respective bond pads 30, so that heat generated during operation of the light emitting devices 10A-10C may be at least partially dissipated through the light bar.

The light emitting diode chips 10A-10C may be connected in electrical series via anode and cathode contacts 62A-62C, 64A-64C as illustrated in FIG. 10. thus, the active regions 14A-14D of each of the light emitting diode chips 10A-10C may be connected in electrical series. Light output from the light bar 100 may be thereby enhanced even though the light bar includes fewer light emitting devices 10A-10C, because the light bar 100 still includes a large number of active regions 14A-14D. Moreover, the light bar can be run at lower current than a light bar having a similar number of conventional light emitting devices with similar active junction areas. Also, the overall level of voltage that is applied to be light bar 100 may be better matched to an external power supply, so that less voltage must be dropped outside the light bar, thereby decreasing the complexity of a system in which the light bar is used.

Figure 11:
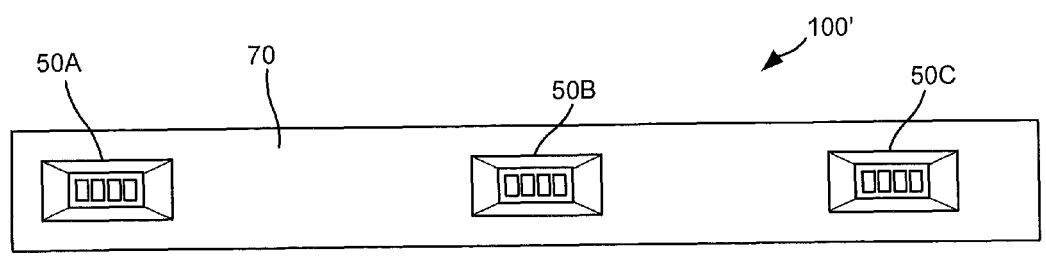

FIG. 11 is a plan view of a light bar 100' including a plurality of multiple emitter light emitting diode packages 50A to 50C according to some embodiments. The LED packages 50A to 50C may have a structure similar to the package 50 illustrated in FIG. 7 and/or the package 50' illustrated in FIG. 8. The LED packages 50A to 50C may be connected in electrical series. Accordingly, the light bar 100' may have fewer light emitters (the packaged devices 50A to 50C) with higher light emission and higher forward voltage than a light bar that included packages with only one or two LED junctions per package.

Figure 12:
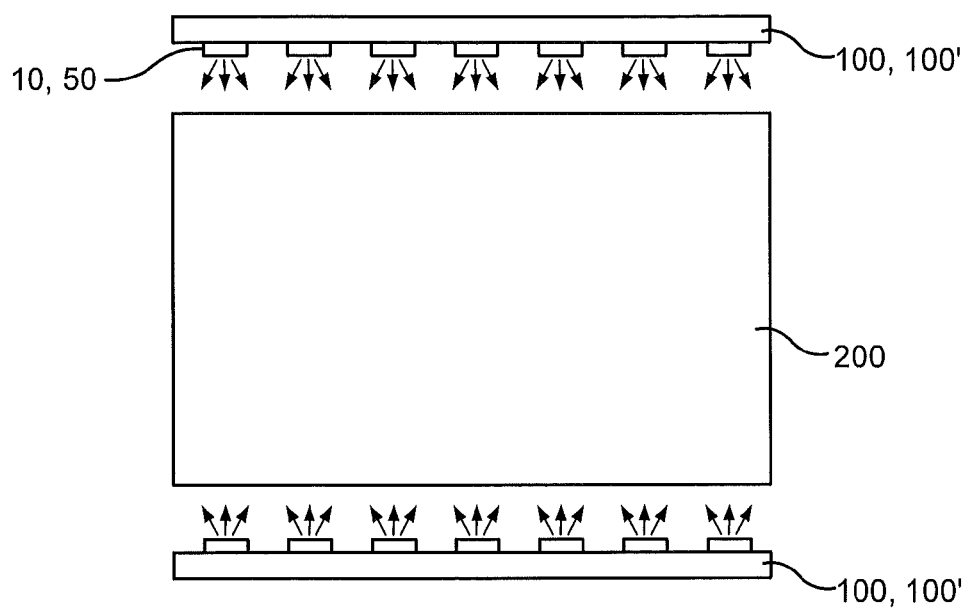
FIG. 12 is a schematic diagram illustrating a backlight assembly for a liquid crystal display screen.
Figure 13:
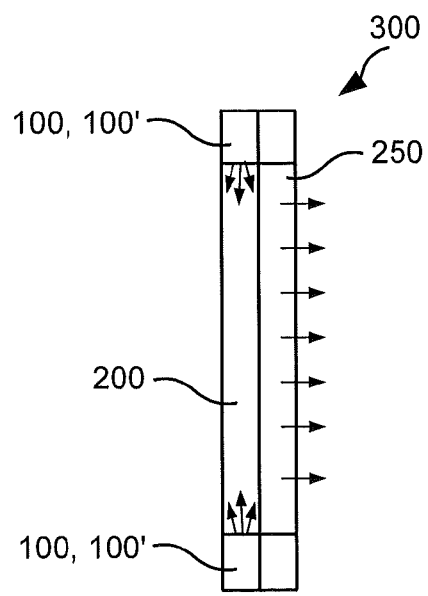
FIG. 13 is a side cross-sectional view of a liquid crystal diode display according to some embodiments.

FIG. 12 is a partial exploded diagram illustrating portions of a backlight assembly for a liquid crystal display screen, while FIG. 13 is a side cross sectional view of an LCD display panel 300 according to some embodiments. As shown therein, a backlight assembly may include a diffuser sheet 200 and a plurality of light bars 100, 100', each including a plurality of light emitters 10, 50 arranged in a linear array to transmit light into an edge of the diffuser sheet 200. Light emitted by the light bars 100, 100' is diffused by the diffuser sheet and transmitted in a direction normal to the figure shown in FIG. 12 into an LCD screen 250 to provide backlighting for the LCD screen 250.

Figure 14A:
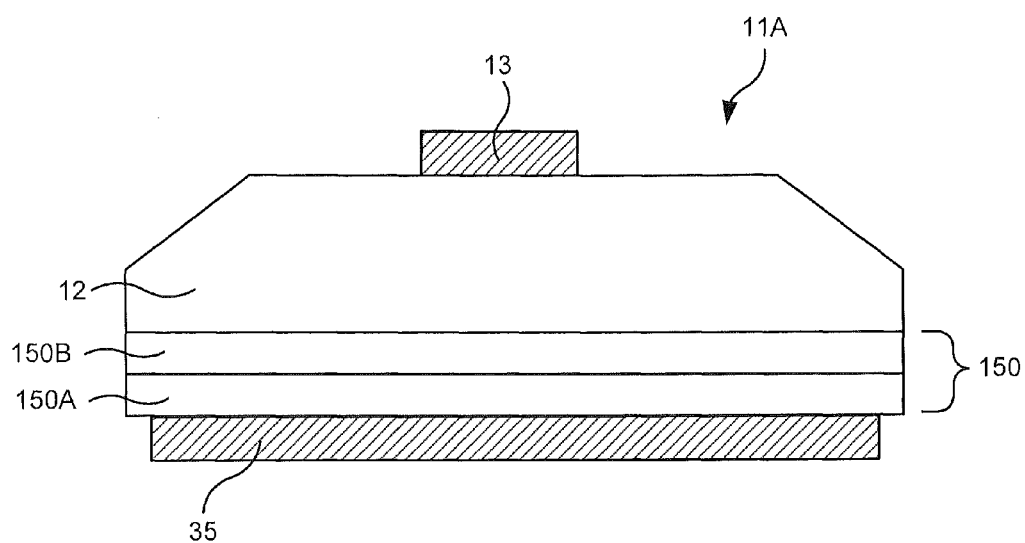
FIGS. 14A, 14B and 14C are cross-sectional views of light emitting diode structures according to further embodiments.
Figure 14B:
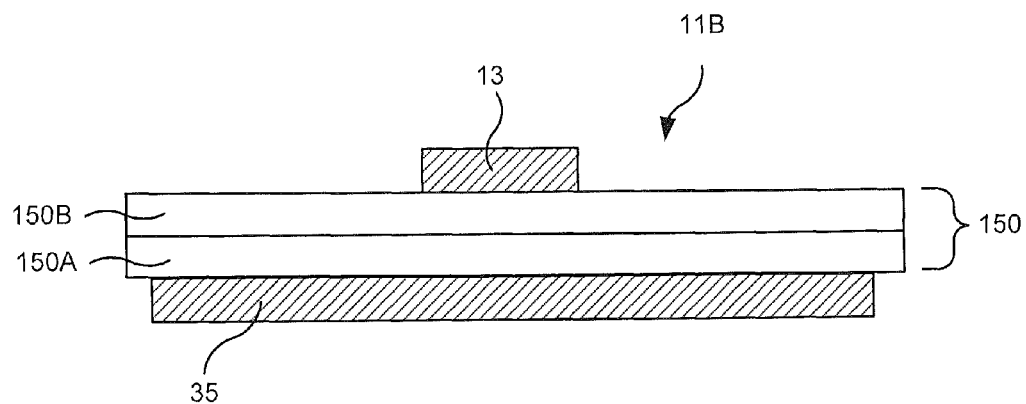
Figure 14C:
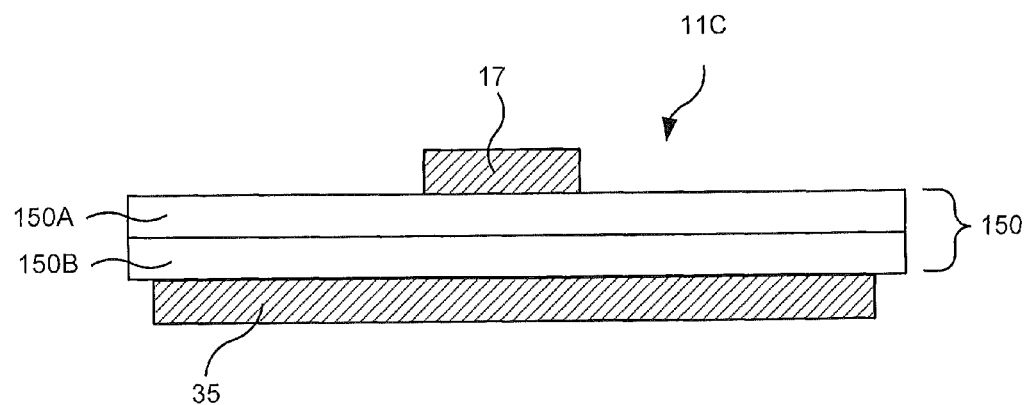

FIGS. 14A, 14B and 14C are cross views of light emitting diode structures according to further embodiments. In particular, the light emitting diode structures 11A and 11B may be mounted in a flip-chip configuration. Referring to FIG. 14A, the light emitting diode structure 11A may include a substrate 12, which may be a growth substrate or a carrier substrate on which an active region 150 is provided. The active region 150 may include a p-type epitaxial region 150A and an n-type epitaxial region 150B layered on the substrate 12. A cathode contact 13 is on the substrate 12, while a die attach pad 35 is on the p-type epitaxial region 150A and provides an anode contact for the diode 11A. The die attach pad 35 may have a structure as described above with respect to FIG. 5, and, accordingly, may be configured to reflow at low temperatures but solidify to provide a bond that is stable at high temperatures.

Referring to FIG. 14B, the light emitting diode structure 11B may be similar to the light emitting diode structure 11A, except that the substrate 12 has been removed using conventional substrate removal techniques.

Referring to FIG. 14C, the light emitting diode structure 11C may be similar to the light emitting diode structure 11B, except that the die attach pad 35 is on the n-type epitaxial region 150B and an anode contact 17 is on the p-type epitaxial region 150A.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A light emitting diode chip, comprising:
   a support layer having a first face and a second face opposite the first face;
   a diode region on the first face of the support layer; and
   a die attach pad on the second face of the support layer, the die attach pad comprising a gold-tin structure having a weight percentage of tin greater than 40%, wherein the die attach pad comprises:
   a first layer of gold;
   a layer of tin on the first layer of gold;
   a layer of nickel on the layer of tin; and
   a second layer of gold on the layer of nickel.

2. The light emitting diode chip of claim 1, wherein the support layer is insulating or semi-insulating.

3. The light emitting diode chip of claim 1, wherein the support layer comprises semi-insulating silicon carbide.

4. The light emitting diode chip of claim 1, wherein the diode region comprises a plurality of isolated active regions on the first face of the support layer, each of the isolated active regions comprising an anode contact and a cathode contact.

5. The light emitting diode chip of claim 4, further comprising a first bond pad on an anode contact of a first one of the isolated active regions and a second bond pad on a cathode contact of a second one of the isolated active regions.

6. The light emitting diode chip of claim 4, wherein the isolated active regions are connected in electrical series.

7. The light emitting diode chip of claim 6, further comprising:
   a first bond pad on an anode contact of a first one of the isolated active regions and a second bond pad on a cathode contact of a second one of the isolated active regions;
   a current spreading finger on the anode contact of the first one of the isolated active regions; and
   an electrical interconnect conductively connecting the cathode contact of the second one of the isolated active regions to the current spreading finger, wherein the current spreading finger extends perpendicular to the electrical interconnect.

8. The light emitting diode chip of claim 4, wherein the isolated active regions are arranged in a row extending from a first end of the support layer to a second end of the support layer opposite the first end, and wherein the cathode contact of each of the isolated active regions is provided on a side of the isolated active region nearest the second end of the support layer.

9. The light emitting diode chip of claim 4, wherein the isolated active regions include a first active region and a second active region adjacent the first active region, the light emitting diode chip further comprising an insulating layer between the first active region and the second active region, and a solid electrical interconnect on the insulating layer and conductively connecting the cathode contact of the first active region to the anode contact of the second active region.

10. The light emitting diode chip of claim 1, wherein a thickness of the layer of tin is about three times a combined thickness of the first layer of gold and the second layer of gold.

11. The light emitting diode chip of claim 1, wherein the weight percentage of tin in the die attach pad is at least about 50%.

12. The light emitting diode chip of claim 1, wherein the weight percentage of tin in the die attach pad is at least about 60%.

13. The light emitting diode chip of claim 1, wherein the weight percentage of tin in the die attach pad is at least about 70%.

14. The light emitting diode chip of claim 1, wherein the weight percentage of tin in the die attach pad is at least about 75%.

15. The light emitting diode chip of claim 1, wherein the weight percentage of tin in the die attach pad is at least about 90%.

16. The light emitting diode chip of claim 1, further comprising a layer of titanium between the die attach pad and the support layer.

17. The light emitting diode chip of claim 16, further comprising a layer of platinum between the die attach pad and the layer of titanium.

18. The light emitting diode chip of claim 17, further comprising a layer of nickel between the die attach pad and the layer of platinum.

19. A light emitting diode chip, comprising:
a diode region having a first face and a second face; and
a die attach pad on the first face of the diode region, the die attach pad comprising a gold-tin structure having a weight percentage of tin greater than 40%, wherein the die attach pad comprises:
a first layer of gold;
a layer of tin on the first layer of gold;
a layer of nickel on the layer of tin; and
a second layer of gold on the layer of nickel.

20. The light emitting diode chip of claim 19, wherein a thickness of the layer of tin is about three times a combined thickness of the first layer of gold and the second layer of gold.

21. The light emitting diode chip of claim 19, wherein the weight percentage of tin in the die attach pad is at least about 50%.

22. The light emitting diode chip of claim 19, wherein the weight percentage of tin in the die attach pad is at least about 60%.

23. The light emitting diode chip of claim 19, wherein the weight percentage of tin in the die attach pad is at least about 70%.

24. The light emitting diode chip of claim 19, wherein the weight percentage of tin in the die attach pad is at least about 75%.

25. The light emitting diode chip of claim 19, wherein the weight percentage of tin in the die attach pad is at least about 90%.

26. The light emitting diode chip of claim 19, further comprising a layer of titanium between the die attach pad and the diode region.

27. The light emitting diode chip of claim 26, further comprising a layer of platinum between the die attach pad and the layer of titanium.

28. The light emitting diode chip of claim 27, further comprising a layer of nickel between the die attach pad and the layer of platinum.

29. The light emitting diode of chip of claim 19, further comprising a substrate on the second face of the diode region opposite the die attach pad.

30. A light emitting diode chip, comprising:
a diode region having a first face and a second face; and
a die attach pad on the first face of the diode region;
wherein the die attach pad comprises:
a first layer of gold;
a layer of tin on the first layer of gold;
a layer of nickel on the layer of tin; and
a second layer of gold on the layer of nickel; and
wherein a weight percentage of tin in the die attach pad relative to a total weight of the layer of tin and the first and second layers of gold is greater than 20%.

31. The light emitting diode of claim 30, further comprising an anode contact on the second face of the diode region, wherein the die attach pad comprises a cathode contact.

32. The light emitting diode of claim 30, further comprising a cathode contact on the second face of the diode region, wherein the die attach pad comprises an anode contact.

33. The light emitting diode of claim 30, further comprising a substrate on the second face of the diode region and a cathode contact on the substrate, wherein the die attach pad comprises an anode contact.

34. A light emitting diode chip, comprising:
a support layer having a first face and a second face opposite the first face;
a diode region on the first face of the support layer, wherein the diode region comprises a plurality of isolated active regions on the first face of the support layer, each of the isolated active regions comprising an anode contact and a cathode contact; and
a metal die attach pad on the second face of the support layer, wherein the metal die attach pad comprises:
a first layer of gold;
a layer of tin on the first layer of gold;
a layer of nickel on the layer of tin; and
a second layer of gold on the layer of nickel.

35. The light emitting diode chip of claim 34, further comprising a first bond pad on an anode contact of a first one of the isolated active regions and a second bond pad on a cathode contact of a second one of the isolated active regions.

36. The light emitting diode chip of claim 34, wherein the isolated active regions are connected in electrical series.

37. The light emitting diode chip of claim 36, further comprising a first bond pad on an anode contact of a first one of the isolated active regions and a second bond pad on a cathode contact of a second one of the isolated active regions.

38. The light emitting diode chip of claim 34, wherein the isolated active regions are arranged in a row extending from a first end of the support layer to a second end of the support layer opposite the first end, and wherein the cathode contact of each of the isolated active regions is provided on a side of the isolated active region nearest the second end of the support layer.

39. The light emitting diode chip of claim 34, wherein the isolated active regions include a first active region and a second active region adjacent the first active region, the light emitting diode chip further comprising an insulating layer between the first active region and the second active region, and an electrical interconnect on the insulating layer and conductively connecting the cathode contact of the first active region to the anode contact of the second active region.

40. The light emitting diode chip of claim 34, wherein the die attach pad comprises a gold-tin structure having a weight percentage of tin greater than 40%.

41. The light emitting diode chip of claim 1, wherein the die attach pad further comprises:
a layer of titanium on the second face of the support layer;
a layer of platinum on the layer of titanium; and
a second layer of nickel between the layer of platinum and the first layer of gold.

* * * * *